(12) United States Patent
Hsieh

(10) Patent No.: US 11,141,822 B2
(45) Date of Patent: Oct. 12, 2021

(54) SYSTEM AND METHOD FOR ASSEMBLING HOOK TYPE HEATSINK

(71) Applicant: ARRIS Enterprises LLC, Suwanee, GA (US)

(72) Inventor: Ti-Hsing Hsieh, Taipei (TW)

(73) Assignee: ARRIS ENTERPRISES LLC, Suwanee, GA (US)

(*) Notice: Subject to any disclaimer, the term of this patent is extended or adjusted under 35 U.S.C. 154(b) by 714 days.

(21) Appl. No.: 15/380,819

(22) Filed: Dec. 15, 2016

(65) Prior Publication Data

US 2018/0177084 A1  Jun. 21, 2018

(51) Int. Cl.
| | |
|---|---|
| *B23P 19/04* | (2006.01) |
| *B23P 19/10* | (2006.01) |
| *H01L 23/40* | (2006.01) |
| *H05K 1/02* | (2006.01) |
| *H05K 3/32* | (2006.01) |

(52) U.S. Cl.
CPC ............... *B23P 19/04* (2013.01); *B23P 19/10* (2013.01); *B23P 2700/10* (2013.01); *H01L 23/4093* (2013.01); *H05K 1/0209* (2013.01); *H05K 3/326* (2013.01); *H05K 2201/066* (2013.01); *H05K 2201/10265* (2013.01); *H05K 2203/0165* (2013.01); *H05K 2203/0195* (2013.01); *H05K 2203/1509* (2013.01); *H05K 2203/166* (2013.01)

(58) Field of Classification Search
CPC ............. F28F 2275/08; F28F 2275/085; F28F 2275/10; B23P 19/04; B23P 19/10; B23P 2700/10; H05K 2203/0195; H05K 2203/166; H05K 2203/167
See application file for complete search history.

(56) References Cited

U.S. PATENT DOCUMENTS

2017/0057025 A1* 3/2017 Dai .................... B23P 19/04

* cited by examiner

*Primary Examiner* — Christopher J Besler
(74) *Attorney, Agent, or Firm* — Wenderoth, Lind & Ponack, L.L.P.

(57) ABSTRACT

A system is provided for installing a heatsink onto a circuit board. The heatsink has a base, a first hook and a second hook. The system includes a heatsink holder, a circuit board arm, a heatsink pusher, and a hook pusher. The heatsink holder is operable to receive the heatsink. The circuit board arm is operable to move the circuit board onto the heatsink received on the heatsink holder such that the bottom surface of the heatsink is adjacent to the circuit board. The heatsink pusher is operable to move the heatsink holder in a first direction so as to move the first hook relative to the first catch. The hook pusher is operable to push the first hook in a direction normal to the base from the top surface to the bottom surface.

7 Claims, 13 Drawing Sheets

SYSTEM AND METHOD FOR ASSEMBLING HOOK TYPE HEATSINK

BACKGROUND

Embodiments of the invention relate to devices and methods to assemble a heat sink to a circuit board.

FIG. 1 illustrates a heatsink.

As shown in the figure, a heatsink 100 includes a hook assembly 102, a base top surface 108 and a base bottom surface 110. Hook assembly 102 further includes a hook 104 and a hook 106.

Heatsink 100 may be any type of heat exchanging device that aids in cooling electronic components on a circuit board. Hook assembly 102 is rotatably connected to heatsink 100 such that it can freely rotate within heatsink 100. Hook assembly 102 may be constructed of any material that is elastic enough to allow a user to push down on hook 104 and hook 106 at the same time when connecting heatsink 100 to a circuit board.

Hook 104 and hook 106 are generally biased in a direction extending from base bottom surface 110 to base top surface 108, such that when both hook 104 and hook 106 are pushed toward base bottom surface 110 at the same time, a torsional force is imparted to hook assembly 102.

FIGS. 2A-B illustrate a conventional method to assemble a heatsink to a circuit board. In particular, FIG. 2A illustrates a wide-angle view of the entire circuit board 206, whereas FIG. 2B illustrates a narrow focus on the securing method.

As shown in the figures, a user is assembling heat sink 100 to a circuit board 206 using a tool 202. Circuit board 206 includes two latches, one of which is shown as a latch 204, and a plurality of additional circuit components, an example of which is indicated as component 208.

Tool 202 can be any tool that would facilitate attaching hook 104 to latch 204.

Latch 204 is connected to circuit board 206 such that latch 204 is in a fixed position on circuit board 206. Latch 204 connects to hook 104 and prevents hook 104 from returning to its equilibrium position.

FIGS. 3A-E illustrate how a circuit board is shifted during the conventional assembly method.

As shown in the figures, circuit board 206 further includes latch 310. Latch 310 is in a fixed position on circuit board 206. Latch 310 connects to hook 106 and prevents hook 106 from returning to its equilibrium position.

Starting in FIG. 3A, to begin attaching heatsink 100 to circuit board 206, the user places base bottom surface 110 on circuit board 206. Then, as shown in FIG. 3B, using tool 202, the user presses on hook 104 in the direction of arrow 302, forcing hook 104 towards circuit board 206. While maintaining the downward force on hook 104, the user then slides heatsink 100 in the direction of arrow 304 until hook 104 engages with latch 204. When the user confirms hook 104 is engaged with latch 204, the user removes tool 202 by lifting tool 202 in the direction of arrow 318.

The user then continues to push heatsink 100 in the direction of arrow 304 until the user believes hook 106 will not contact latch 310 when hook 106 is forced toward circuit board 206. Then, the user uses tool 202 to push hook 106 in the direction of arrow 312, forcing hook 106 towards circuit board 206. While maintaining the downward force on hook 106, the user then slides heatsink 100 in the direction of arrow 314 until hook 106 engages with latch 310. When the user confirms hook 106 is engaged with latch 310, the user removes tool 202 by lifting tool 202 in the direction of arrow 316.

Upon removal of tool 202, hook 104 is engaged with latch 204 and hook 106 is engaged with latch 310. Because hook assembly 102 is generally rigid and hook 104 and hook 106 were forced away from their equilibrium positions, hook 106 and hook 104 impart forces to latch 310 and latch 204, respectively, that are perpendicular to circuit board 206. These forces keep heatsink 100 in the desired position on circuit board 206.

As show by the above description, assembling a heat sink to a circuit board is very labor intensive and may require more than one worker. The time required for the assembly, coupled with the manual labor cost, makes the current process expensive. There exists a need for an automated solution to assemble a heatsink to a circuit board to reduce the assembly time and eliminate unnecessary manual labor.

SUMMARY

Aspects of the present invention are drawn to a system for installing a heatsink onto a circuit board. The heatsink has a base, a first hook and a second hook. The base has a top surface and a bottom surface. The first hook is biased in a direction normal to the base from the bottom surface to the top surface. The second hook is biased in the direction normal to the base from the bottom surface to the top surface. The circuit board has a receiving area to receive the base, a first catch arranged to be hooked by the first hook and a second catch arranged to be hooked by the second hook. The system includes a heatsink holder, a circuit board arm, a heatsink pusher, and a hook pusher. The heatsink holder is operable to receive the heatsink. The circuit board arm is operable to move the circuit board onto the heatsink received on the heatsink holder such that the bottom surface of the heatsink is adjacent to the circuit board. The heatsink pusher is operable to move the heatsink holder in a first direction so as to move the first hook relative to the first catch. The hook pusher is operable to push the first hook in a direction normal to the base from the top surface to the bottom surface.

BRIEF SUMMARY OF THE DRAWINGS

The accompanying drawings, which are incorporated in and form a part of the specification, illustrate example embodiments and, together with the description, serve to explain the principles of the invention. In the drawings.

DETAILED DESCRIPTION

The present invention provides a device and method to assemble a heatsink to a circuit board in an automated manner.

The invention provides this automation by using a machine to mimic the steps taken to manually assemble a heatsink to a circuit board. A worker loads a heatsink into a machine, and the machine lowers a circuit board until it contacts the heatsink. Then, a combination of heat sink pushers and hook pushers move the heat sink and hooks in such a way as to connect hooks on the heat sink with latches on the circuit board. When the cycle is complete, a worker removes the assembly from the machine.

Aspects of the present invention will now be described with reference to FIGS. 4-6.

Figure 1:
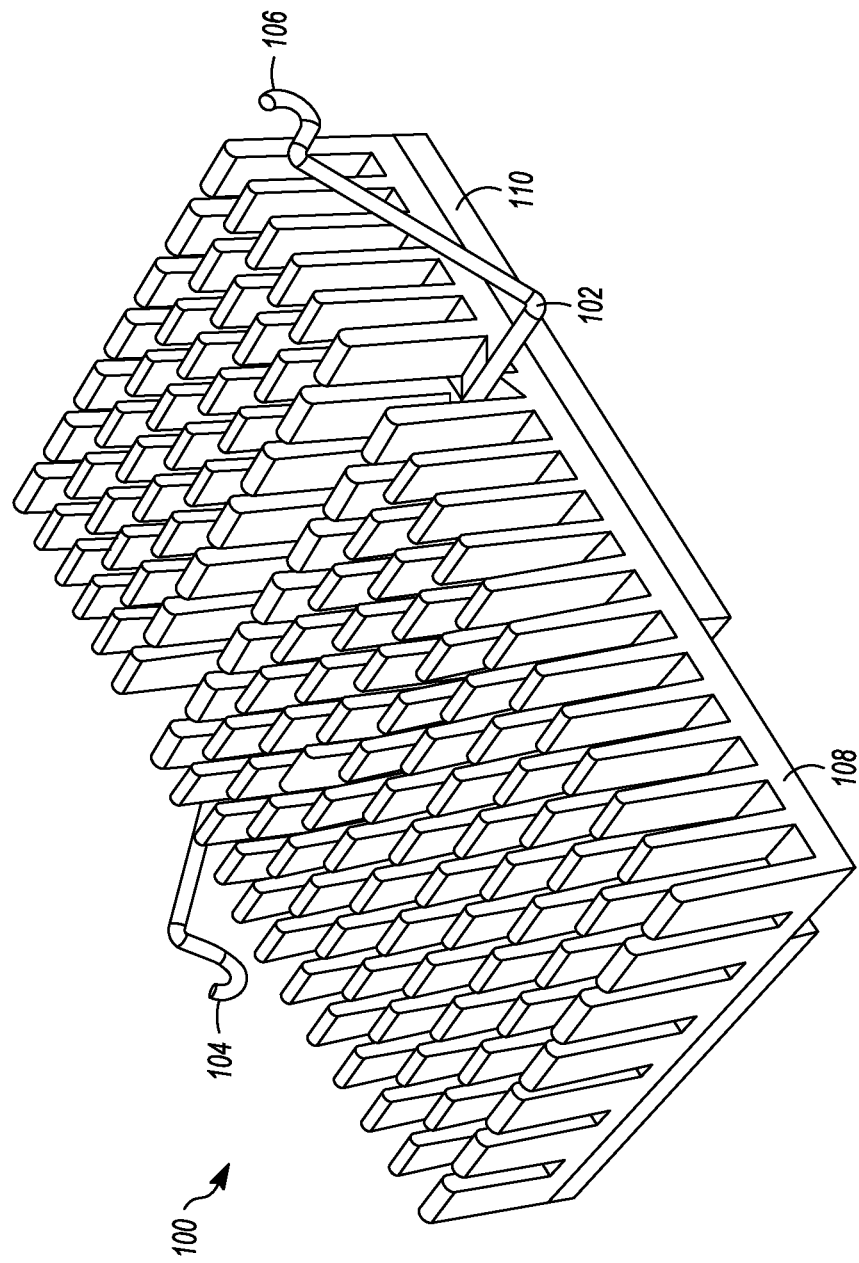
FIG. 1 illustrates a heatsink.
Figure 2A:
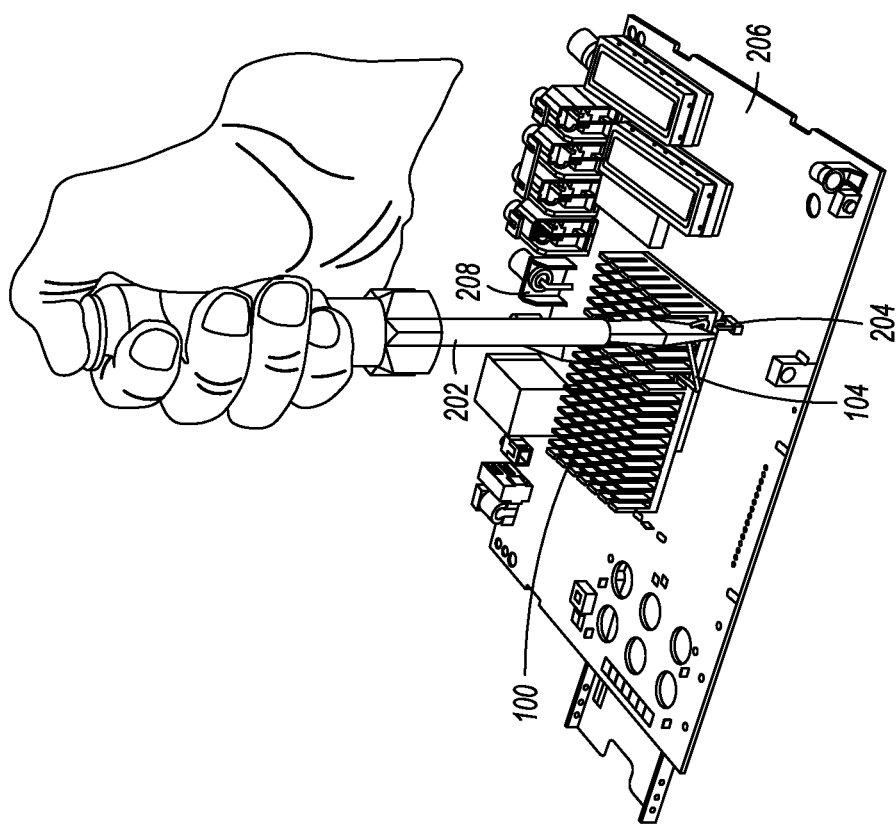
FIGS. 2A-B illustrate a conventional method to assemble a heatsink to a circuit board.
Figure 2B:
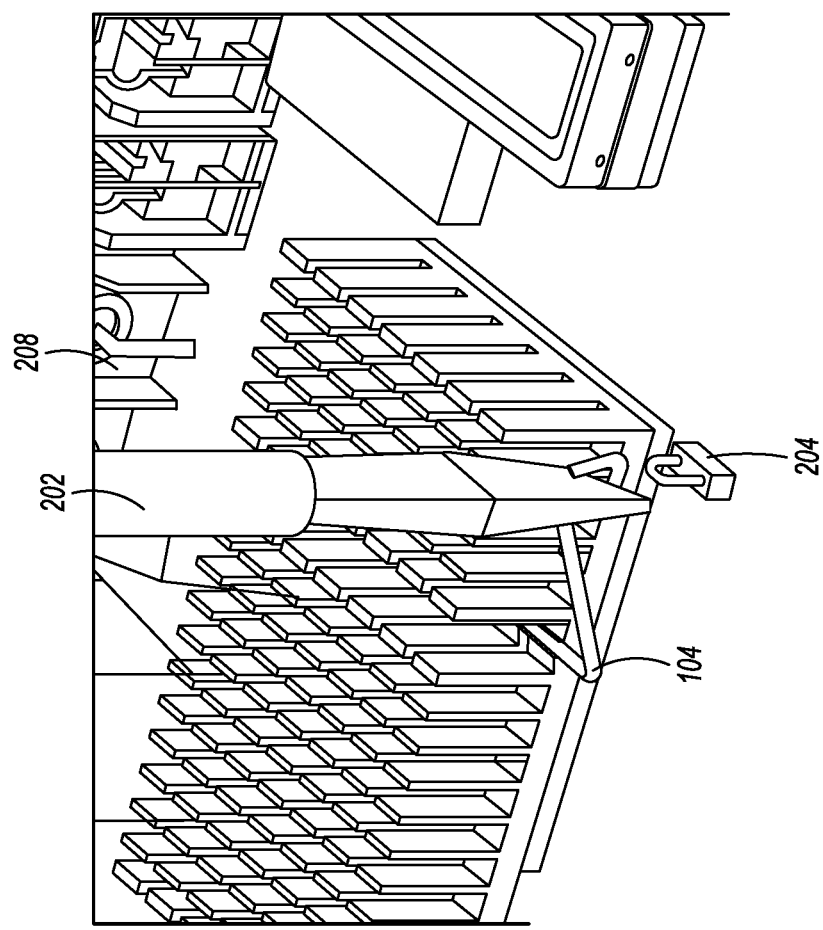
Figure 3A:
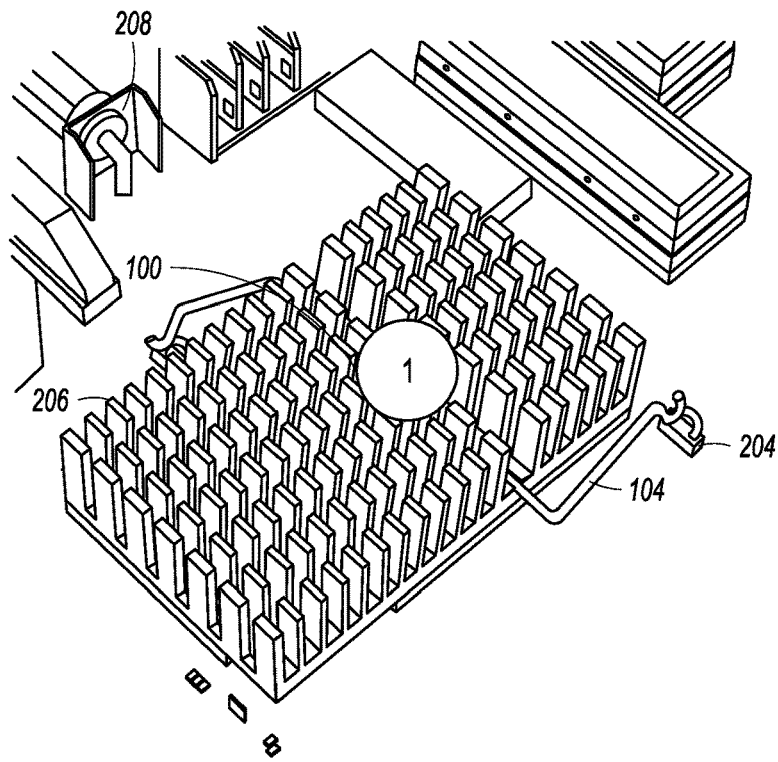
FIGS. 3A-E illustrate how a circuit board is shifted during the conventional assembly method.
Figure 3B:
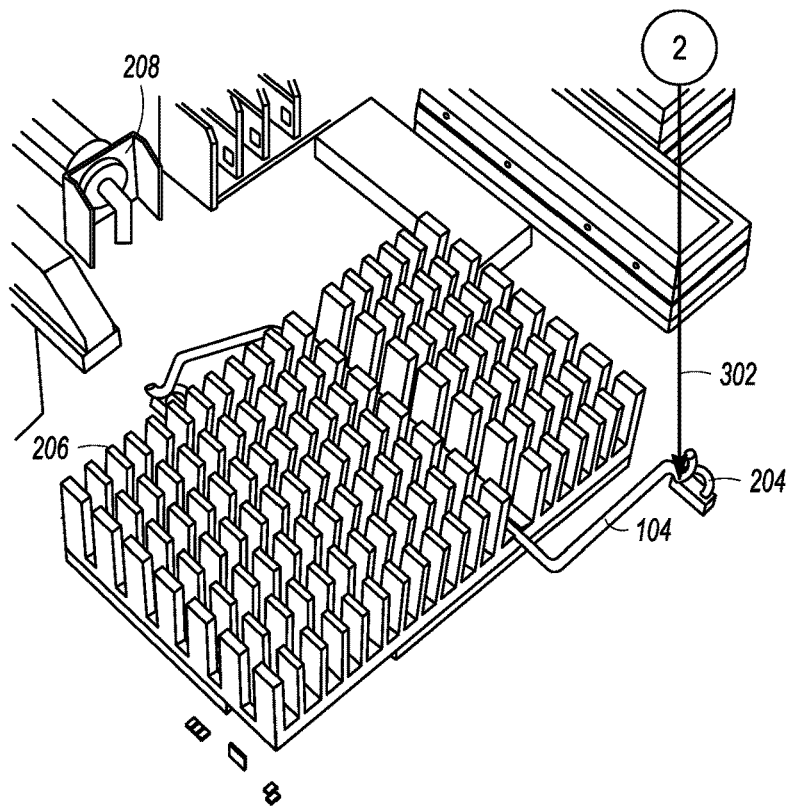
Figure 3C:
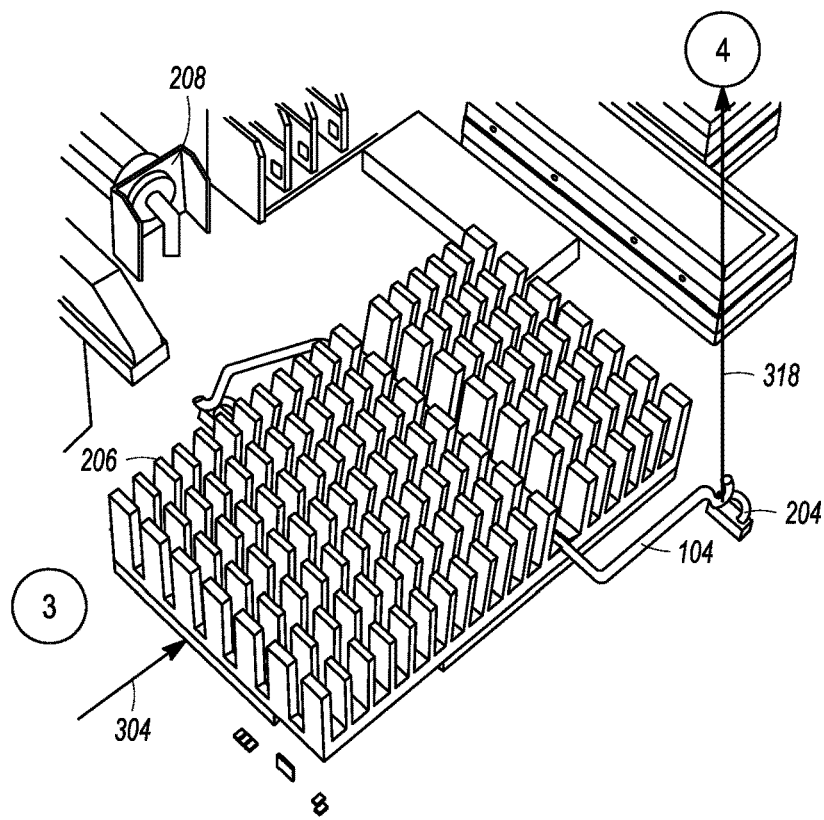
Figure 3D:
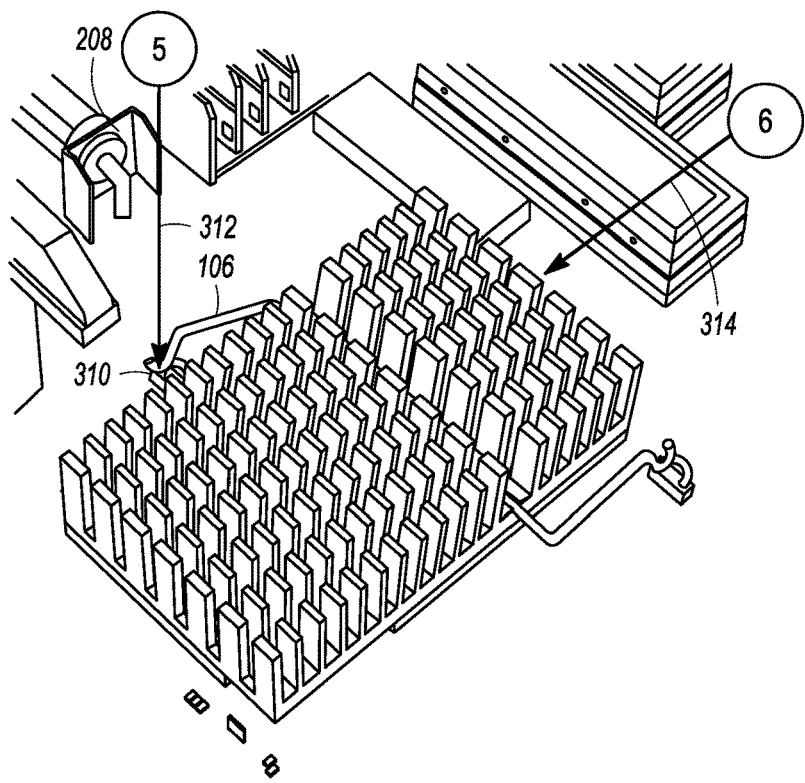
Figure 3E:
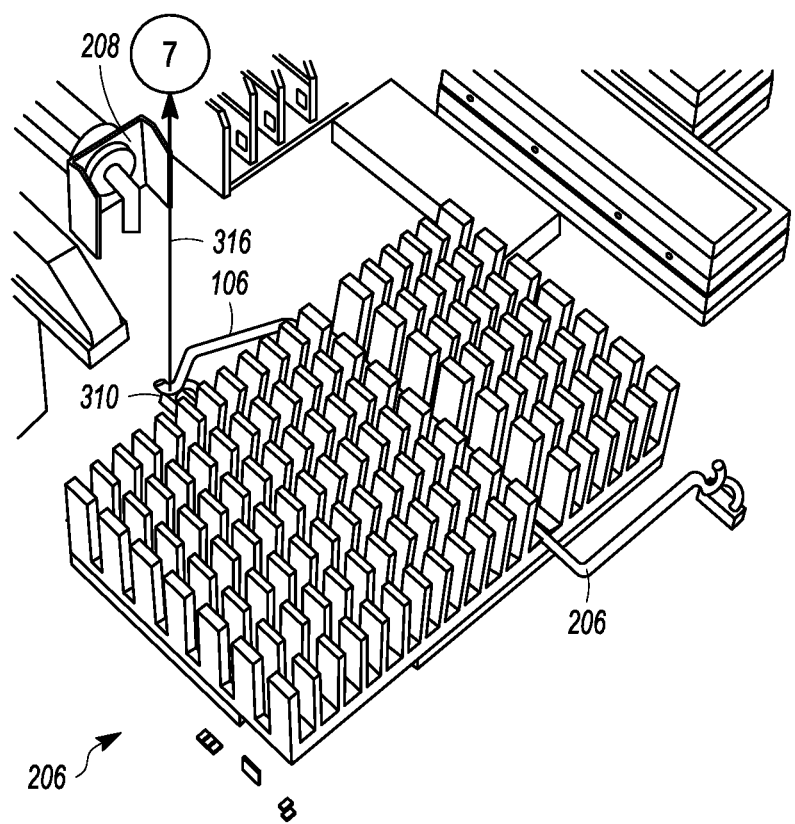
Figure 4:
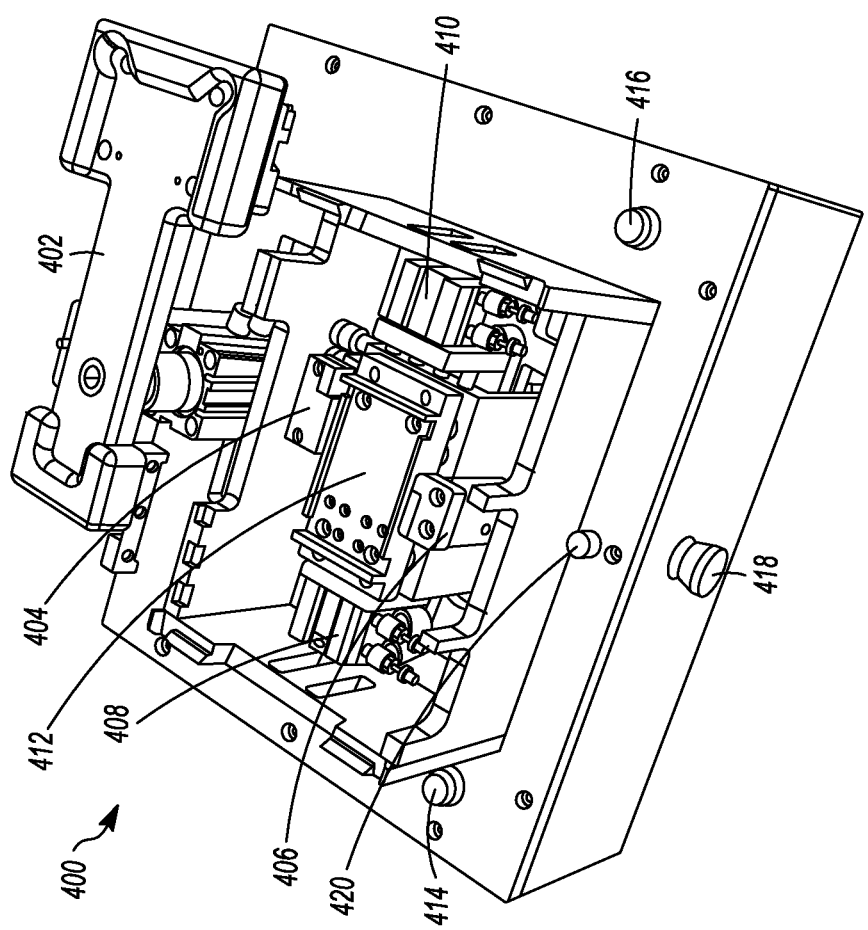
FIG. 4 illustrates a device to assemble a heatsink to a circuit board in accordance with aspects of the present invention.

FIG. 4 illustrates a device to assemble a heatsink to a circuit board in accordance with aspects of the present invention.

As shown in the figure, an assembly system 400 includes a circuit board arm 402, a hook pusher 404, a hook pusher 406, a heatsink pusher 408, a heatsink pusher 410, a heatsink holder 412, a start button 414, a start button 416, a light 418 and an emergency stop 420.

Circuit board arm 402 may be any device or system that can pick up a circuit board and position the circuit board properly for further assembly operations.

Hook pusher 404 and hook pusher 406 generally move in a vertical direction, up or down, and may be any device or system that can move the hooks of a heatsink when the heatsink is being assembled to a circuit board.

Heatsink pusher 408 and heatsink pusher 410 generally move in a horizontal direction, and may be any device or system that can move heatsink holder 412 when the heatsink is being assembled to a circuit board.

Heatsink holder 412 is a platform on which a heatsink is placed to begin the process of assembling a heatsink to a circuit board.

Start button 414 and start button 416 are electrically connected to the rest of the components of assembly system 400, such that when start button 414 and start button 416 are pressed simultaneously, assembly system 400 is activated.

Light 418 is an indicator light to notify the worker that assembly system 400 is operating. Light 418 may be any type or color of light that provides a clear indication when assembly system 400 is operating.

Emergency stop 420 is electrically connected to the rest of the components of assembly system 400 such that when emergency stop 420 is activated, assembly system 400 is deactivated.

Figure 5A:
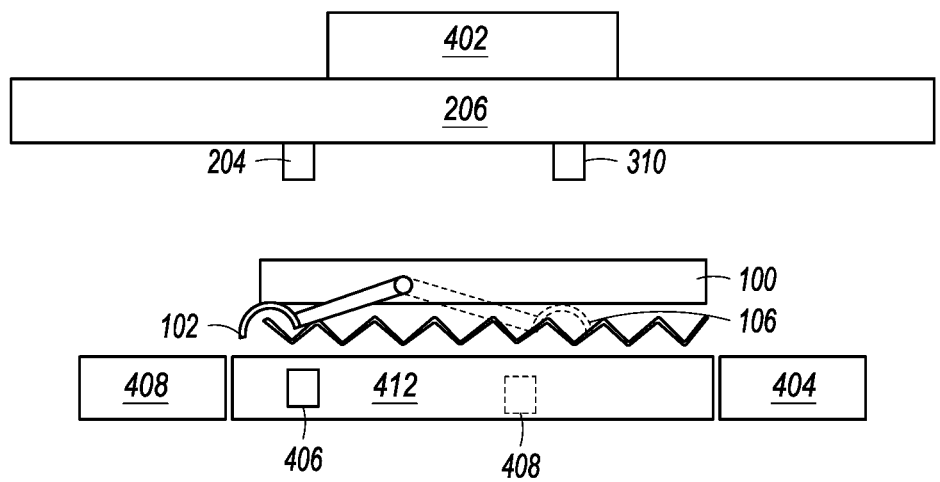
FIGS. 5A-J illustrate how the heatsink is assembled to a circuit board in accordance with aspects of the present invention.
Figure 5B:
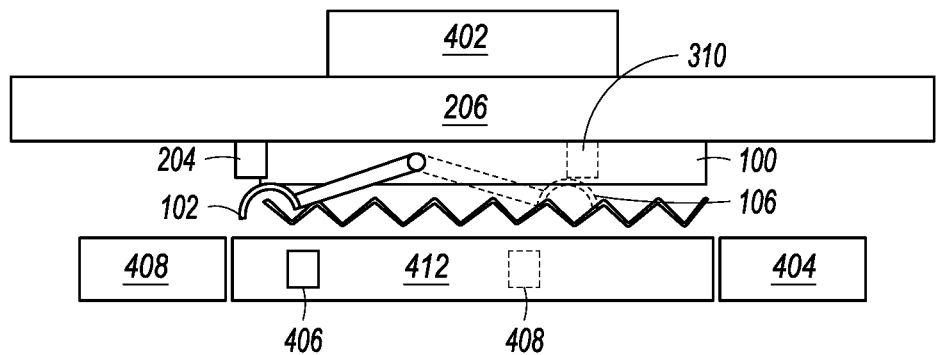
Figure 5C:
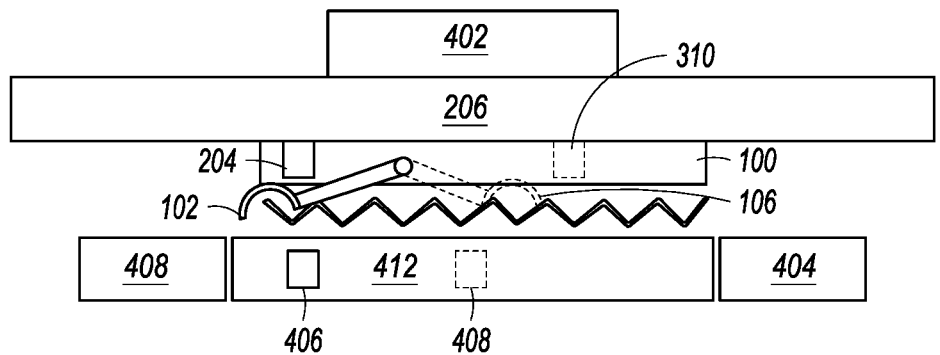
Figure 5D:
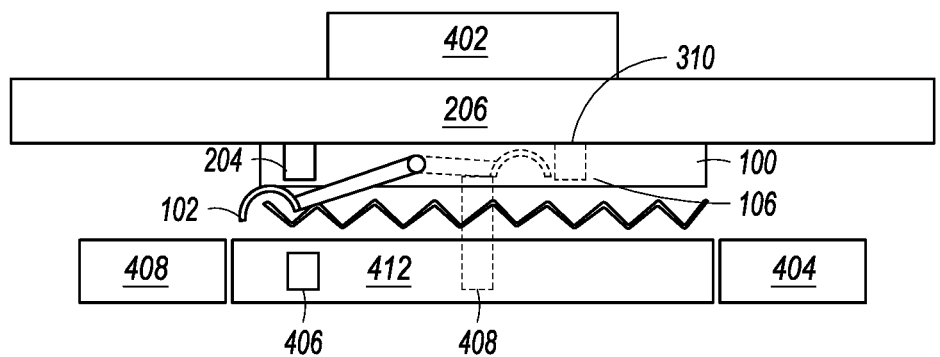
Figure 5E:
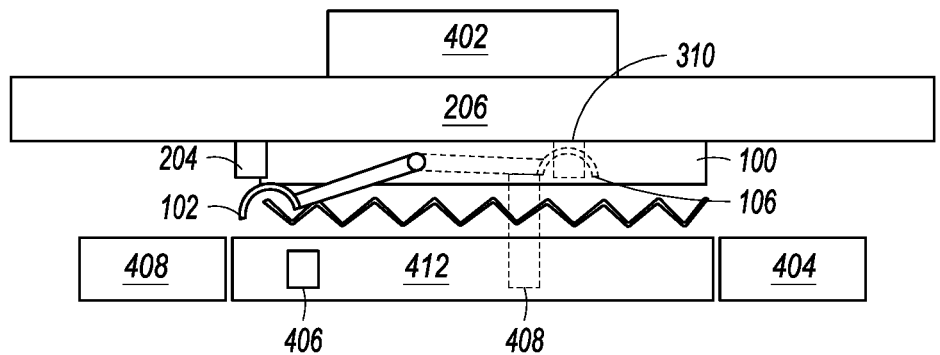
Figure 5F:
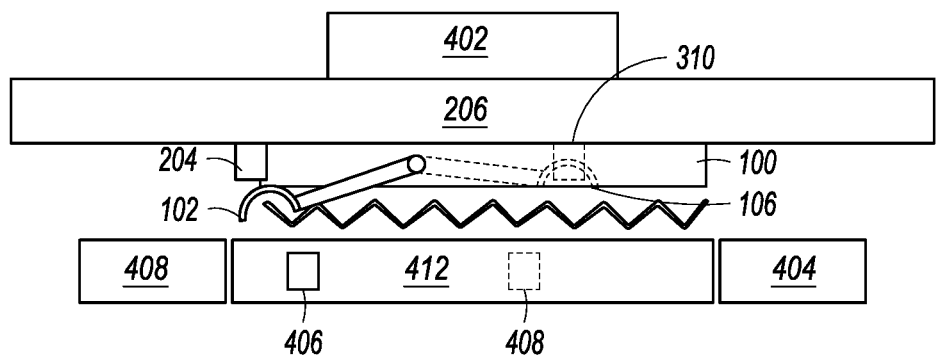
Figure 5G:
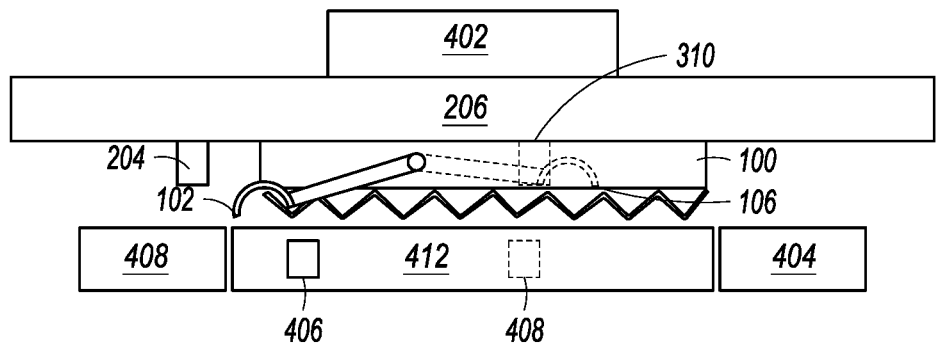
Figure 5H:
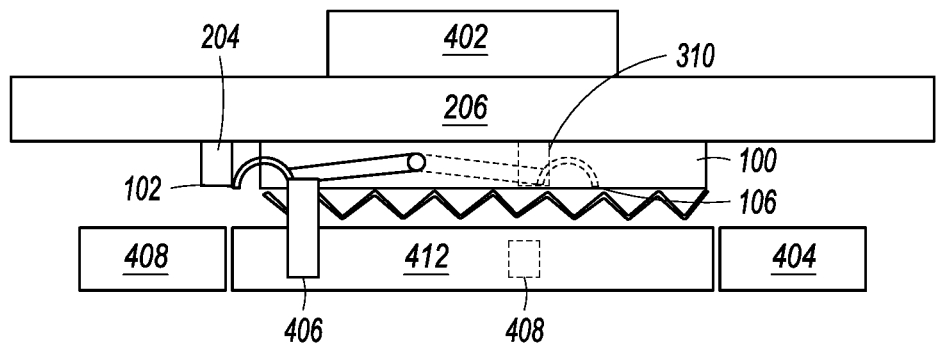
Figure 5I:
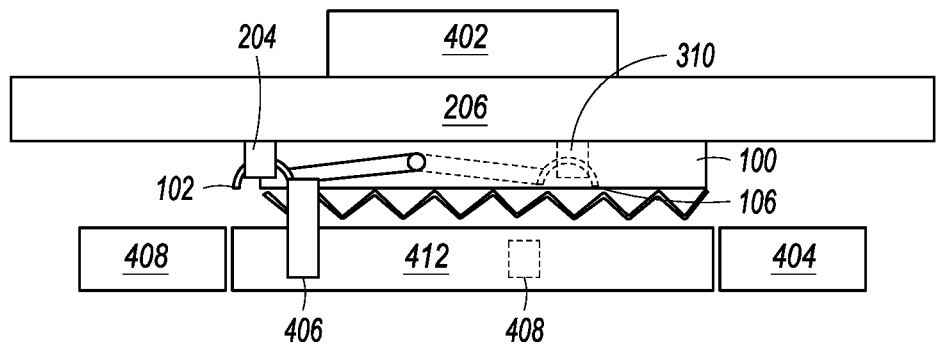
Figure 5J:
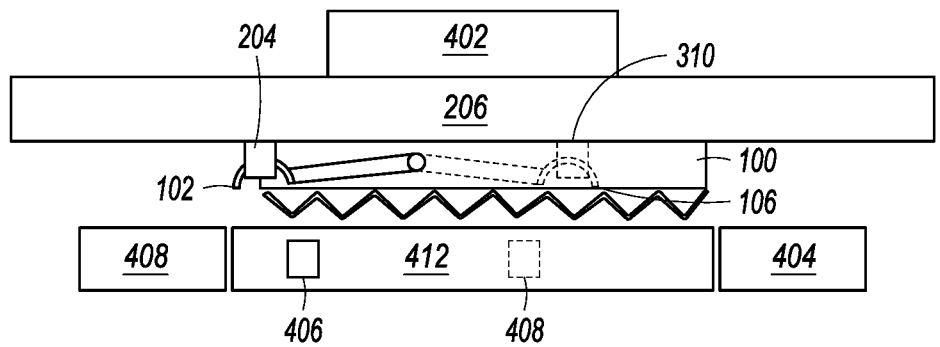
Figure 6:
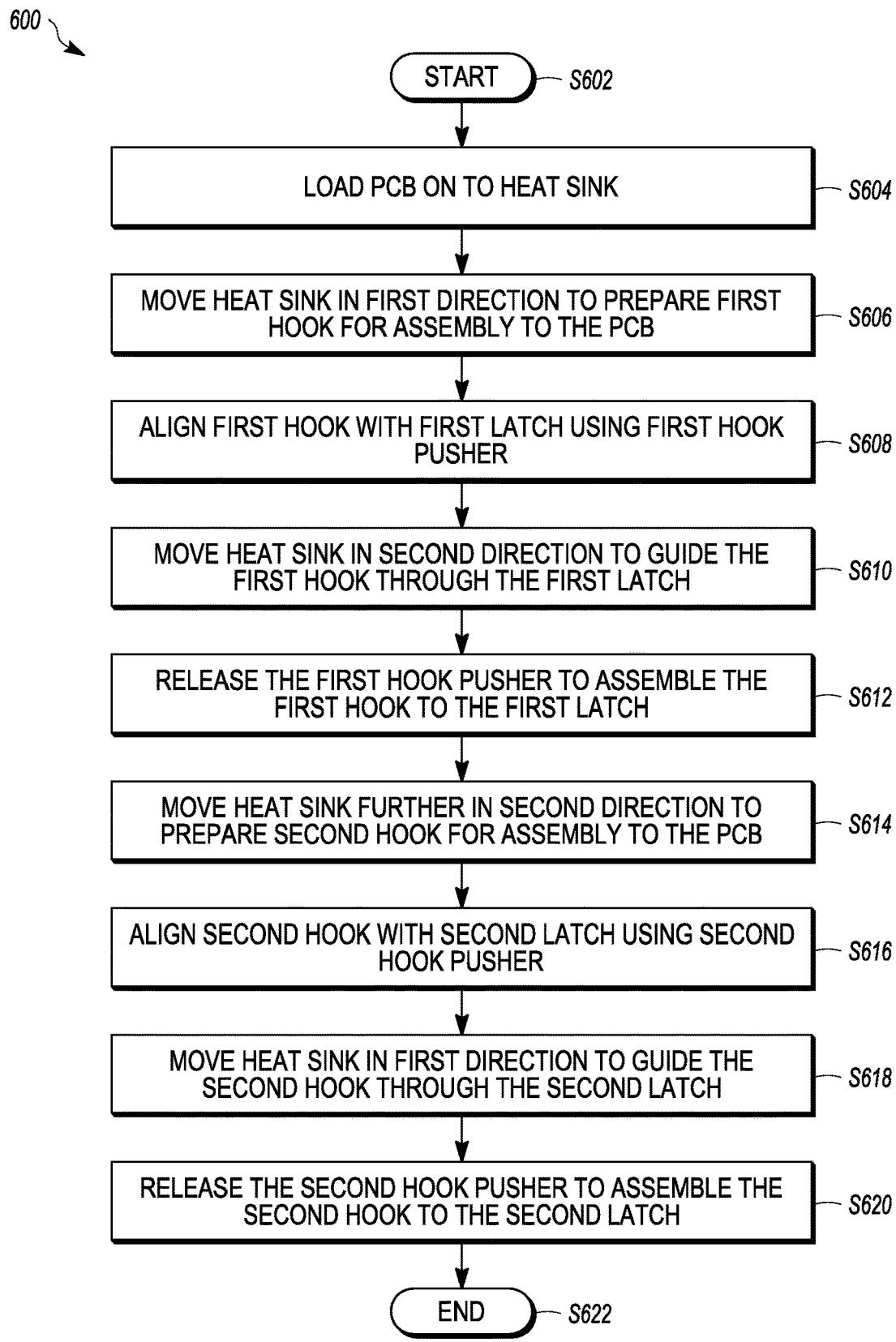
FIG. 6 illustrates a method by which a heatsink is assembled to a circuit board in accordance with aspects of the present invention.

FIGS. 5A-J illustrate how a heatsink is assembled to a circuit board in accordance with aspects of the present invention, and FIG. 6 illustrates a process by which a heatsink is assembled to a circuit board in accordance with aspects of the present invention.

As shown in FIG. 6, process 600 starts (S602) and a circuit board is loaded on to a heatsink (S604).

Returning to FIGS. 4 and 5A, to begin the assembly process a worker will load heatsink 100 on to heatsink holder 412. Heatsink 100 is loaded on to heatsink holder 412 in an inverted fashion such that the base of heatsink 100 is facing up. The worker then presses start button 414 and start button 416 simultaneously to activate assembly system 400. Simultaneous pressing of start button 414 and start button 416 ensures that the worker's hands remain out of the way of assembly system 400 to prevent accidental injury. When the worker presses start button 414 and start button 416, light 420 illuminates to notify the worker that assembly system 400 is operating.

Circuit board arm 402 may then pick up circuit board 206 using any conventional means by which automated systems pick up a circuit board for further processing. As a non-limiting example, circuit board 206 may be located on top of a stack of other circuit boards, and after assembly system 400 is activated, circuit board arm 402 may move in a predetermined way to pick up circuit board 206 from the stack. In an alternate embodiment, the worker may load circuit board 206 on to circuit board arm 402 prior to pressing start button 414 and start button 416. After circuit board 206 is loaded on to circuit board arm 402, circuit board arm 402 moves circuit board 206 such that circuit board 206 is positioned above heatsink 100.

Referring to FIG. 5B, circuit board arm 402 then lowers circuit board 206 such that circuit board 206 contacts heatsink 100. At this time, if an attempt were made to assemble heatsink 100 to circuit board 206, hook 104 would interfere with latch 204 and hook 106 would interfere with latch 310 such that assembly would be impossible.

Returning to FIG. 6, heatsink holder 412 is moved to prepare hook 106 for assembly to circuit board 206 (S606).

Returning to FIG. 5C, assembly system 400 activates heatsink pusher 410, and heatsink pusher 410 moves heatsink holder 412 until hook 106 cannot interfere with latch 310 when hook 106 is moved upward.

Referring back to FIG. 6, hook 106 is aligned with latch 310 (S608).

Returning to FIG. 5D, assembly system activates hook pusher 404, and hook pusher 404 moves upward and contacts hook 106. Hook pusher 404 continues to move upward, causing hook 106 to move upward as well. Hook pusher 404 continues to move upward until hook 106 cannot interfere with latch 310 when hook 106 is moved back toward latch 310.

Returning to FIG. 6, heatsink holder 412 is moved to guide hook 106 through latch 310 (S610).

Referring back to FIG. 5E, assembly system 400 activates heatsink pusher 408, and heatsink pusher 408 moves heatsink holder 412 until hook 106 is guided through latch 310.

Returning to FIG. 6, hook pusher 404 is released (S612).

Referring back to FIG. 5F, assembly system 400 deactivates hook pusher 404, and hook 106 engages with latch 310.

In an alternate embodiment, hook pusher 404 may remain engaged with hook 106 until later in the assembly process so that moving heat sink holder 412 back and forth can be done with greater ease.

Returning to FIG. 6, heatsink holder 412 is moved to prepare hook 102 for assembly to latch 204 (S614).

Returning to FIG. 5G, heatsink pusher 408 pushes heatsink holder 412 further in the direction of latch 310 until hook 104 cannot interfere with latch 204 when hook 102 is moved upward. As heatsink holder 412 moves toward latch 310, hook 106 moves further through latch 310.

Referring back to FIG. 6, hook 102 is aligned with latch 204 (S616).

Returning to FIG. 5H, assembly system 400 activates hook pusher 406, and hook pusher 406 moves upward and contacts hook 102. Hook pusher 406 continues to move upward, causing hook 102 to move upward as well. Hook pusher 406 continues to move upward until hook 102 cannot interfere with latch 204 when hook 102 is moved back toward latch 204.

Referring back to FIG. 6, heatsink holder 412 is moved to guide hook 102 through latch 204 (S618).

Returning to FIG. 5I, assembly system 400 activates heatsink pusher 410, and heatsink pusher 410 moves heatsink holder 412 until hook 102 is guided through latch 204. When heatsink pusher 410 stops, hook 102 is aligned with latch 204 and hook 106 is engaged with latch 310. In the alternate embodiment where hook pusher 404 has not yet released hook 106, hook 106 is not yet engaged with latch 310, but hook 106 is aligned with latch 310.

Referring back to FIG. 6, hook pusher 406 is released (S620).

Returning to FIG. 5J, assembly system 400 deactivates hook pusher 406, and hook 102 engages with latch 204. In the alternate embodiment where hook pusher 404 has not yet released hook 106, assembly system 400 deactivates hook pusher 406, and hook 106 engages with latch 310.

At this point in the assembly process, heatsink 100 is secured to circuit board 206 because hook 102 is engaged with latch 204 and hook 106 is engaged with latch 310.

Returning to FIG. 6, process 600 ends (S622).

When process 600 ends, light 420 may go out, indicating that to the operator that the process is complete. At this point, circuit board arm 402 may release circuit board 206 to allow the operator to remove the circuit board and heatsink assembly from assembly system 400.

If, at any point during process 600, the operator feels that there are errors in process 600, or some of the machinery of assembly system 400 is not operating properly, the operator may press emergency stop button 418 to stop process 600 in order to limit damage to assembly system 400 and the potential for injury to the operator.

In summary, the present invention provides a system and method to assemble a heatsink to a circuit board in an automated fashion. The operator loads a heatsink assembly on to an assembly system, and then activates the assembly system to connect the heatsink to the circuit board. The assembly system is programmed to mimic the operations performed by human operators when manually installing a heatsink on to a circuit board. Assembling a heatsink assembly to a circuit board in this manner eliminates the need for more manufacturing operators and increases the speed of the process.

The foregoing description of various preferred embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A system of installing a heatsink onto a circuit board, the heatsink having a base, a first hook and a second hook, the base having a top surface and a bottom surface, the first hook being biased in a direction normal to the base from the bottom surface to the top surface, the second hook being biased in the direction normal to the base from the bottom surface to the top surface, the circuit board having a receiving area to receive the base, a first catch arranged to be hooked by the first hook and a second catch arranged to be hooked by the second hook, the system comprising:
    a heatsink platform operable to receive the heatsink so that the bottom surface of the heatsink is adjacent to the circuit board; and
    a controller programmed to:
        move the heatsink platform in a first direction and a second direction so as to move the first hook relative to the first catch;
        push the first hook in a direction normal to the base from the top surface to the bottom surface:
        move the heatsink platform in a third direction so as to move the second hook relative to the second catch; and
        push the second hook in the direction normal to the base from the top surface to the bottom surface,
    wherein moving the heatsink platform in the first direction also moves the first hook so as to not to interfere with the first catch and moving the heatsink platform in the second direction also moves the first hook so as to be received by the first catch after the first hook is pushed in the direction normal to the base from the top surface of the bottom surface.

2. The system of claim 1, wherein the controller is operable to control a distance the heatsink platform is moved in the first direction so as to move the first hook relative to the first catch.

3. The system of claim 2, wherein the controller is further operable to control the distance the first hook is moved in the direction normal to the base from the top surface to the bottom surface.

4. The system of claim 1, further comprising a stop button operable to stop operation of the system.

5. The system of claim 1, wherein the controller is further operable to move the heatsink platform in a fourth direction so as to move the second hook relative to the second catch.

6. The system of claim 5, wherein the controller is further operable to push the second hook in the direction normal to the base from the top surface to the bottom surface after moving the heatsink platform in the fourth direction.

7. The system of claim 6, further comprising a stop button operable to stop operation of the system.

* * * * *